US012729340B2

(12) United States Patent
Ohwada et al.

(10) Patent No.: US 12,729,340 B2
(45) Date of Patent: Sep. 8, 2026

(54) SILICON NITRIDE ETCHING LIQUID COMPOSITION

(71) Applicant: Kanto Kagaku Kabushiki Kaisha, Tokyo (JP)

(72) Inventors: Takuo Ohwada, Tokyo (JP); Kohei Mochida, Tokyo (JP); Yuki Yoshida, Tokyo (JP)

(73) Assignee: Kanto Kagaku Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/435,927

(22) PCT Filed: Mar. 6, 2020

(86) PCT No.: PCT/JP2020/009600
§ 371 (c)(1),
(2) Date: Sep. 2, 2021

(87) PCT Pub. No.: WO2020/179901
PCT Pub. Date: Sep. 10, 2020

(65) Prior Publication Data

US 2025/0382520 A1 Dec. 18, 2025

(30) Foreign Application Priority Data

Mar. 7, 2019 (JP) ................................ 2019-041726

(51) Int. Cl.
*C09K 13/06* (2006.01)
*H10P 50/28* (2026.01)

(52) U.S. Cl.
CPC ............ *C09K 13/06* (2013.01); *H10P 50/283* (2026.01)

(58) Field of Classification Search
None
See application file for complete search history.

(56) References Cited

U.S. PATENT DOCUMENTS 4,092,211 A 5/1978 Morris
8,940,182 B2 1/2015 Hong et al.
(Continued)

FOREIGN PATENT DOCUMENTS

CN 108690621 A 10/2018
JP 2000058500 2/2000
(Continued)

OTHER PUBLICATIONS

Machine English translation of KR 10-20170059170 A (Year: 2017).*
(Continued)

*Primary Examiner* — Shamim Ahmed
(74) *Attorney, Agent, or Firm* — McDonnell Boehnen Hulbert & Berghoff LLP

(57) ABSTRACT

The present: invention addresses the problem of providing a silicon nitride etching liquid composition which is capable of selectively etching $Si_3N_4$ with a practical etching selectivity with respect to $SiO_2$, while suppressing regrowth of $SiO_2$, and which is also capable of suppressing pattern collapse of an $SiO_2$ film in the production of a 3D nonvolatile memory cell. A silicon nitride etching liquid composition for producing a 3D nonvolatile memory cell, which contains phosphoric acid, one or more silane coupling agents and water, but which does not contain ammonium ions.

8 Claims, 3 Drawing Sheets

State of stress between patterns after phosphoric acid treatment and rinsing

State of stress between patterns after hydrophobization treatment and rinsing

(56) References Cited

U.S. PATENT DOCUMENTS

| | | | | |
|---|---|---|---|---|
| 9,136,120 | B2 | 9/2015 | Hong et al. | |
| 9,368,647 | B2 | 6/2016 | Hong et al. | |
| 10,103,169 | B1 | 10/2018 | Ge et al. | |
| 10,689,572 | B2 * | 6/2020 | Lee | C09K 13/06 |
| 2013/0092872 | A1 | 4/2013 | Hong et al. | |
| 2014/0213064 | A1 * | 7/2014 | Koide | H10P 72/0408 118/313 |
| 2015/0091075 | A1 * | 4/2015 | Nishitani | H10D 30/0411 438/264 |
| 2018/0142151 | A1 | 5/2018 | Lee et al. | |
| 2019/0074188 | A1 * | 3/2019 | Cooper | C09K 13/08 |
| 2019/0136090 | A1 * | 5/2019 | Park | C09G 1/04 |
| 2019/0249082 | A1 | 8/2019 | Lee et al. | |
| 2019/0367811 | A1 | 12/2019 | Lee et al. | |
| 2020/0157423 | A1 * | 5/2020 | Bilodeau | C09K 13/06 |
| 2020/0263087 | A1 * | 8/2020 | Lim | C09K 13/06 |

FOREIGN PATENT DOCUMENTS

| | | |
|---|---|---|
| JP | 2018182312 | 11/2018 |
| KR | 1020170059170 | 5/2014 |
| KR | 10-1828437 | 3/2018 |
| KR | 101907637 B1 | 12/2018 |
| KR | 101953380 B1 | 2/2019 |

OTHER PUBLICATIONS

First Examination Opinion Notice issued by the Chinese Patent Office in application No. 202080019469.3 dated Nov. 19, 2024. English translation included.

Notice of Submission of Opinions issued by the Korean Patent Office in application No. 10-2021-7032131 dated Nov. 27, 2024. English translation included.

Office Action in corresponding Singapore Application No. 11202110021P dated Feb. 1, 2023.

* cited by examiner

[Fig.1]
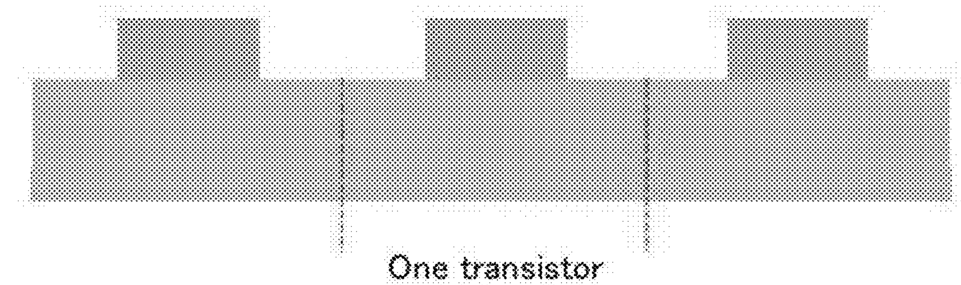
[Fig.2]
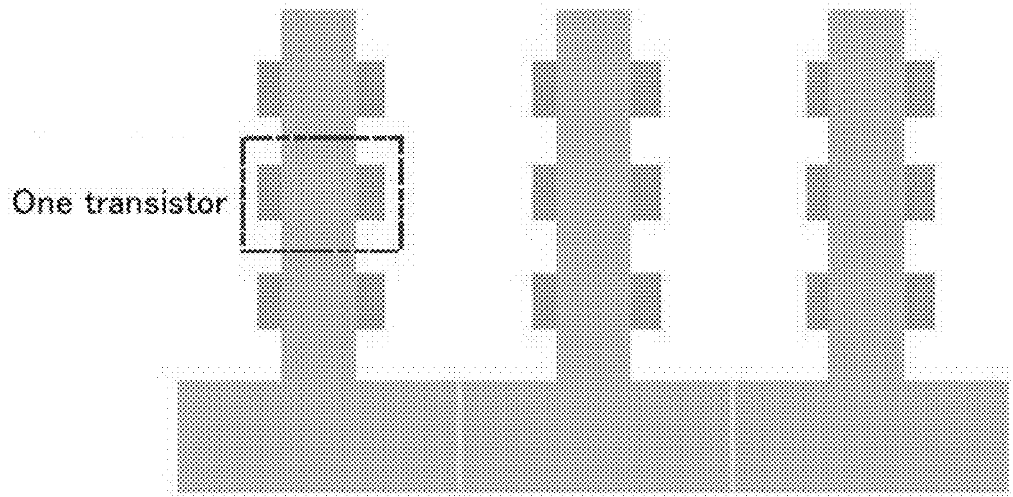
[Fig.3]
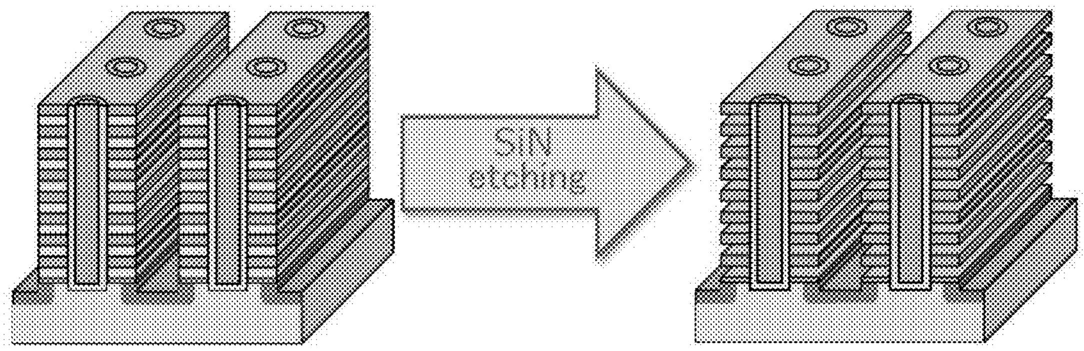

[Fig.4]
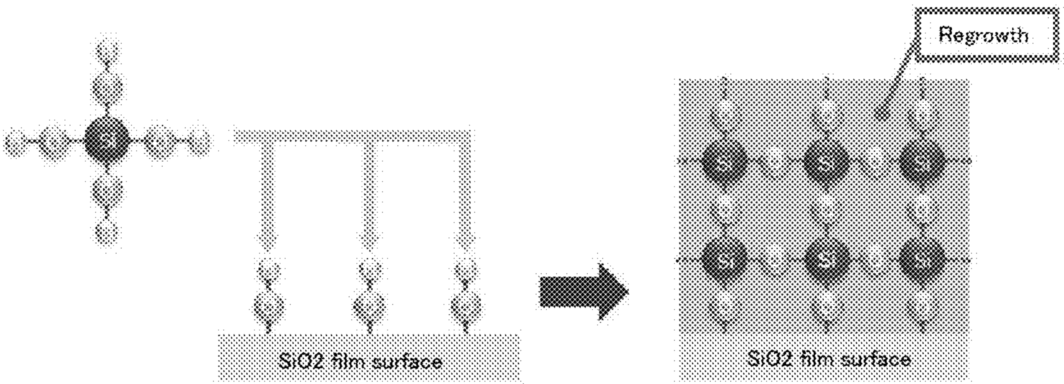
[Fig.5]
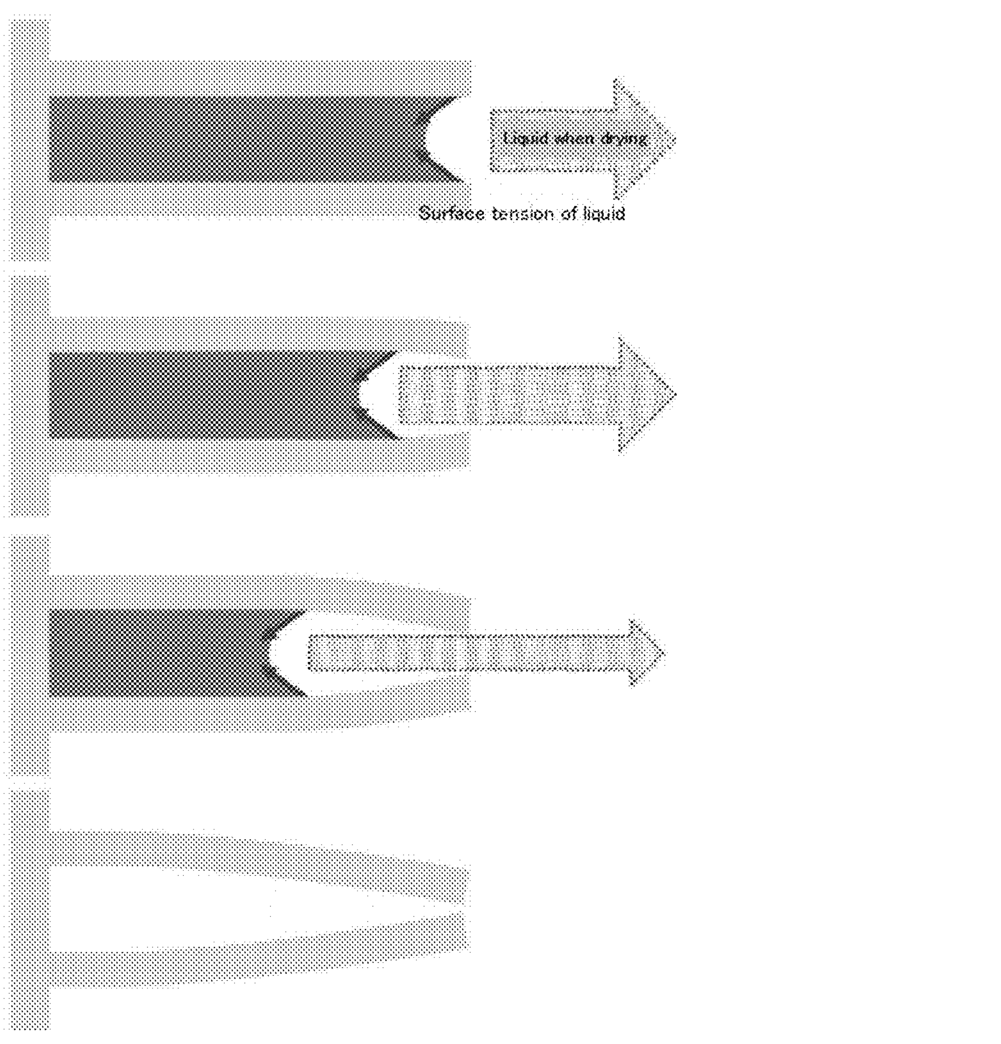

[Fig.6]
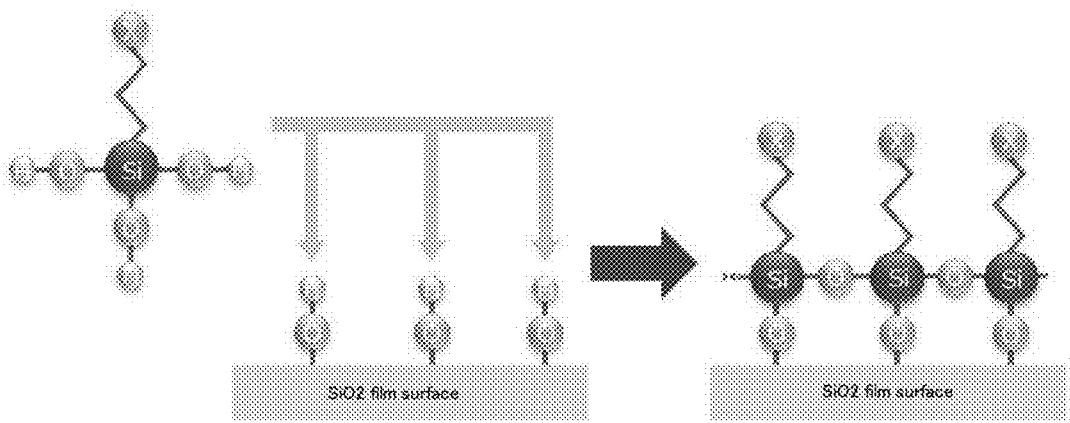
[Fig.7]
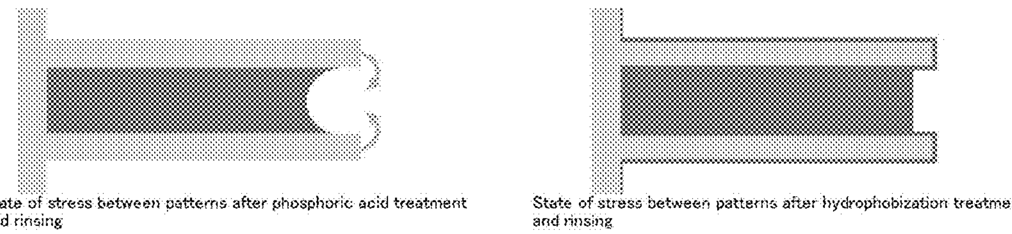
State of stress between patterns after phosphoric acid treatment and rinsing
State of stress between patterns after hydrophobization treatment and rinsing

SILICON NITRIDE ETCHING LIQUID COMPOSITION

This application is a U.S. National Phase application under 35 U.S.C. § 371 of PCT/JP2020/009600, filed Mar. 6, 2020, which claims priority from and the benefit of Japanese Application No.: 2019-041726, filed on Mar. 7, 2019, the specifications of which are hereby incorporated by reference in their entireties into the instant application.

TECHNICAL FIELD

The present invention relates to a silicon nitride etching liquid composition for producing a 3D non-volatile memory cell, and a method for producing a 3D non-volatile memory cell using said etching liquid composition.

BACKGROUND ART

In recent years, technological innovation of NAND flash memories has been progressing in the area of non-volatile memory, which is a memory that retains memory without supplying power. NAND flash memories are used as a storage device for SmartMedia and SSD, and the like.

Conventionally, the structure of NAND flash memory is a planar type (FIG. 1), and the line width becomes narrower as the miniaturization progresses, which adversely affects the life and performance. Recently, development of 3D type (FIG. 2) is progressing, and by stacking vertically, NAND flash memories can be manufactured with a sufficient line width, realizing longer life, higher speed, and larger capacity compared to the conventional type.

As an example of a method for producing 3D NAND flash memories, the following steps are performed: (1) on a substrate on which silicon dioxide ($SiO_2$) and silicon nitride ($Si_3N_4$) are alternately laminated, (2) holes are formed by dry etching, (3) a gate electrode (p-Si electrode) covered with an insulating film ($SiO_2$) is embedded in said holes, (4) grooves (intervals) are formed on the laminated film by dry etching, (5) ions are injected to the substrate surface to form an impurity region, (6) $Si_3N_4$ is etched by wet etching, (7) on the exposed substrate and $SiO_2$ surface, a TiN film is formed as a barrier metal and a W film is formed as an electrode, and (8) TiN and W are collectively etched with mixed acid.

As an etching liquid composition for etching $Si_3N_4$ in the above step (6) (FIG. 3), an etching liquid composition comprising phosphoric acid, ammonium ions and a silicon compound is disclosed (Patent Documents 1 to 3).

When phosphoric acid and silicon compounds are contained in the etching liquid composition, they react to generate $Si(OH)_x$. In the presence of $Si(OH)_x$, the etching rates of $SiO_2$ and $Si_3N_4$ decrease, respectively; however, since the rate of decrease in the etching rate of $SiO_2$ is larger, as a result the etch selectivity of $Si_3N_4$ relative to $SiO_2$ is improved. On the other hand, when $Si(OH)_x$ is excessively present, $Si(OH)_x$ adheres to the surface of $SiO_2$ with a solubility exceeding the saturation solubility, causing regrowth of $SiO_2$ (hereinafter referred to as "regrowth of $SiO_2$") (FIG. 4). Patent Documents 1 to 3 describe that ammonium ions in the etching liquid composition bind to $Si(OH)_x$ to form a water-soluble compound, thereby suppressing the regrowth of $SiO_2$.

In addition, as the etching liquid composition of silicon nitride, the followings are also disclosed: an etching liquid composition comprising an inorganic acid, a siloxane compound, an ammonium compound, and a solvent (Patent Document 4); an etching liquid composition comprising a composite silane consisting of phosphoric acid and two or more kinds of silane compounds, and water (Patent Document 5); as well as an etching liquid composition comprising phosphoric acid and an organic compound comprising silicon, and an organic solvent (Patent Document 6).

CITATION LIST

Patent Documents

[Patent Document 1] U.S. Pat. No. 8,940,182
[Patent Document 2] U.S. Pat. No. 9,136,120
[Patent Document 3] U.S. Pat. No. 9,368,647
[Patent Document 4] JP A No. 2018-085513
[Patent Document 5] JP A No. 2018-182312
[Patent Document 6] JP A No. 2000-058500

SUMMARY OF THE INVENTION

Problems to Be Solved by the Invention

Under the circumstance in which the number of laminated 3D NAND memory cells increases, the present inventors have attempted to improve the etch selectivity of $Si_3N_4$ relative to $SiO_2$, and have investigated to separately dissolve $Si_3N_4$ as a silicon compound in an etching liquid composition comprising phosphoric acid. However, said dissolution required high-temperature and long-term treatment, and the inventors have also faced the problem of high cost of silicon compound. Furthermore, in cases that as the number of laminated memory cells increases, the $SiO_2$ film becomes thinner than the conventional $SiO_2$ film, i.e., the aspect ratio in the unit cell of the laminated structure increases, there has been a concern that the pattern of the $SiO_2$ film would collapse due to the surface tension of the liquid during drying of the substrate, after completion of etching $Si_3N_4$ (FIG. 5).

Therefore, in the production of 3D non-volatile memory cells, the present inventors have proceeded with a study having a task of providing a silicon nitride etching liquid composition that can selectively etch $Si_3N_4$ with a practical etch selectivity for $SiO_2$, suppress the regrowth of $SiO_2$, and also suppress the pattern collapse of the $SiO_2$ film.

Means of Solving the Problems

In earnest research to solve the above problems, the present inventors have found that a silicon nitride etching liquid composition comprising phosphoric acid, one or more kinds of silane coupling agents and water, and not comprising ammonium ions, is capable of, in the production of 3D non-volatile memory cells, selectively etching $Si_3N_4$ with a practical etch selectivity for $SiO_2$ while suppressing the regrowth of $SiO_2$ and suppressing the pattern collapse of the $SiO_2$ film; and moreover, the resent inventors have found that when said etching liquid composition further comprises an inorganic silicate, the etch selectivity of $Si_3N_4$ relative to $SiO_2$ can be further improved; as a result of further research, the present inventors have completed the present invention.

The present inventors presume that the reason why the etching liquid composition comprising phosphoric acid, one or more kinds of silane coupling agents and water, and not comprising ammonium ions, is capable of, in the production of 3D non-volatile memory cells, selectively etching $Si_3N_4$ with a practical etch selectivity for $SiO_2$ while suppressing the regrowth of $SiO_2$ and suppressing the pattern collapse of the $SiO_2$ film, is as follows.

That is, when the etching liquid composition comprises phosphoric acid and a silane coupling agent, these react and are adsorbed on the surface of $SiO_2$, and as a result, the etch selectivity of $Si_3N_4$ relative to $SiO_2$ is improved. In addition, since the etching liquid composition comprises a silane coupling agent, adhesion of $Si(OH)_x$ to the surface of $SiO_2$ can be prevented, and regrowth of $SiO_2$ can be suppressed (FIG. 6). Furthermore, it is presumed that the inclusion of a hydrophobic group in the silane coupling agent can make the surface of the $SiO_2$ film hydrophobic, increase the contact angle, and prevent the pattern collapse of the $SiO_2$ film (FIG. 7).

Namely, the present invention relates to the following:

[1] A silicon nitride etching liquid composition for producing a 3D non-volatile memory cell, comprising phosphoric acid, one or more kinds of silane coupling agents and water, and not comprising ammonium ions.

[2] The etching liquid composition according to [1], wherein the silane coupling agent is a compound represented by the formula 1:

[Chemical formula 1]

(formula I)

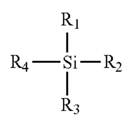

wherein $R_1$ is an alkyl group or an alkoxy group, $R_2$ is an alkyl group or an alkoxy group, $R_3$ is an alkyl group or an alkoxy group, $R_4$ is a group comprising one or more selected from the group consisting of N atoms, O atoms, S atoms, P atoms, Cl atoms and F atoms.

[3] The etching liquid composition according to [2], wherein the silane coupling agent is the one in which at least two of $R_1$, $R_2$, and $R_3$ in the formula 1 are alkoxy groups.

[4] A The etching liquid composition according to [2] or [3], wherein the silane coupling agent comprises an amino group or a mercapto group in $R_4$ of the formula 1.

[5] The etching liquid composition according to any one of [2] to [4], wherein the silane coupling agent further comprises a phenyl group or an octyl group in $R_4$ of the formula 1.

[6] The etching liquid composition according to any one of [2] to [5], wherein the silane coupling agent is selected from the group consisting of 3-aminopropyltrimethoxysilane, 3-aminopropyltriethoxysilane, 3-(2-aminoethylamino)propyltrimethoxysilane, 3-(2-aminoethylamino)propyltriethoxysilane, trimethoxy [3-(methylamino)propyl]silane, [3-(N,N-dimethylamino)propyl]trimethoxysilane, trimethoxy [3-(phenylamino)propyl]silane, N-[2-(N-vinylbenzylamino)ethyl]-3-aminopropyltrimethoxysilane, N-[8-(trimethoxysilyl)octyl]ethane-1,2-diamine, N-[3-(trimethoxysilyl)propyl]-1-butaneamine, [3-(diethylamino)propyl]trimethoxysilane, 3-[(1,3-dimethylbutylidene)amino]propyltriethoxysilane, (3-mercaptopropyl)trimethoxysilane, (3-mercaptopropyl)triethoxysilane and N,N-bis[(diphenylphosphino)methyl]-3-(triethoxysilyl)propylamine.

[7] The etching liquid composition according to any one of [1] to [6], comprising 60 to 95 wt % of phosphoric acid and 0.01 to 10 wt % of a silane coupling agent.

[8] The etching liquid composition according to any one of [1] to [7], further comprising one or more kinds of water-soluble polar organic solvents.

[9] The etching liquid composition according to [8], wherein the water-soluble polar organic solvent is selected from the group consisting of methanol, ethanol and acetone.

[10] The etching liquid composition according to any one of [1] to [9], further comprising an inorganic silicate.

[11] The etching liquid composition according to [10], wherein the inorganic silicate is sodium silicate or potassium silicate.

[12] A method of producing a 3D non-volatile memory cell, which comprises etching silicon nitride using the etching liquid composition according to any one of [1] to [11].

[13] A 3D non-volatile memory cell obtained by etching silicon nitride using the etching liquid composition according to any one of [1] to [11].

Advantageous Effects of the Invention

The etching liquid composition of the present invention can selectively etch $Si_3N_4$ with a practical etch selectivity for $SiO_2$ in the production of 3D non-volatile memory cells, and can suppress regrowth of $SiO_2$ and also suppress pattern collapse of a $SiO_2$ film. In other words, $Si_3N_4$ can be selectively etched safely in a short time and economically, without a need to separately dissolve $Si_3N_4$ in the etching liquid composition. Furthermore, since the regrowth of $SiO_2$ can be suppressed even when the etching liquid composition does not comprise ammonium ions, production cost of the etching liquid composition can be suppressed. In addition, even in the production of a highly laminated 3D non-volatile memory cell, the memory cell having a stable pattern can be produced without collapsing the pattern of a $SiO_2$ film.

Moreover, when the etching liquid composition of the present invention further comprises an inorganic silicate, the etch selectivity of $Si_3N_4$ relative to $SiO_2$ can be further improved.

BRIEF DESCRIPTION OF DRAWINGS

FIG. 1 is a diagram showing a structure of planar NAND flash memory.

FIG. 2 is a diagram showing a structure of 3D NAND flash memory.

FIG. 3 is a diagram showing before and after etching $Si_3N_4$.

FIG. 4 is a diagram showing principle of regrowth of $SiO_2$.

FIG. 5 is a diagram showing principle of pattern collapse of $SiO_2$ film.

FIG. 6 is a diagram principle of suppressing regrowth of $SiO_2$.

FIG. 7 is a diagram showing suppression of pattern collapse of $SiO_2$ film.

EMBODIMENTS FOR CARRYING OUT THE INVENTION

Hereinafter, the present invention will be described in detail based on preferred embodiments of the present invention.

The present invention relates to a silicon nitride etching liquid composition for producing a 3D non-volatile memory cell, comprising phosphoric acid, one or more kinds of silane coupling agents and water and not comprising ammonium ions.

The etching liquid composition of the present invention is a silicon nitride etching liquid composition for producing a 3D non-volatile memory cell.

As long as the 3D non-volatile memory is a non-volatile memory of 3D type, the type and operation format of the memory are not particularly limited, and examples thereof include 3D NAND flash memories, etc. The etching liquid composition of the present invention is particularly suitable for producing a 3D non-volatile memory having a high lamination or a high aspect ratio of a unit cell, and examples of such memory include those with a $SiO_2$ film having a film thickness of 10 nm to 50 nm.

The silane coupling agent used in the present invention is not particularly limited, and it is preferably a compound represented by the formula 1:

[Chemical formula 2]

(formula I)

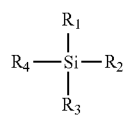

wherein $R_1$ is an alkyl group or an alkoxy group, $R_2$ is an alkyl group or an alkoxy group, $R_3$ is an alkyl group or an alkoxy group, $R_4$ is a group comprising one or more selected from the group consisting of N atoms, O atoms, F atoms, P atoms, S atoms and Cl atoms.

The alkyl groups of $R_1$ to $R_3$ in the formula 1 are linear, branched and cyclic alkyl groups which may have a substituent.

The linear alkyl group is not particularly limited, and examples thereof include a methyl group, an ethyl group, a propyl group, a butyl group, a pentyl group, a hexyl group, a heptyl group, an octyl group, a nonyl group, and a decyl group, etc.

The branched alkyl group is not particularly limited, and examples thereof include an isopropyl group, an isobutyl group, as sec-butyl group, a tert-butyl group, and an isopentyl group, etc.

The cyclic alkyl group is not particularly limited, and examples thereof include cyclobutyl, cyclopentyl, a cyclohexyl group, and a cyclooctyl group, etc.

The alkoxy groups of $R_1$ to $R_3$ in the formula 1 are linear, branched and cyclic alkoxy groups which may have a substituent.

Examples of the linear, branched, and cyclic alkoxy groups include alkoxy groups in which an oxygen atom is located at the 1-position of the above linear, branched, and cyclic alkyl groups.

$R_4$ which is a group comprising one or more selected from the group consisting of N atoms, O atoms, F atoms, P atoms, S atoms and Cl atoms is not particularly limited, and examples thereof include an amino group, an alkoxy group, a fluoro group, a phosphine group, a mercapto group, and a chloro group, etc. $R_4$ may further comprise an alkyl group, a phenyl group, and an ether, etc.

As the silane coupling agent, more preferably, at least two of $R_1$ to $R_3$ of the formula 1 are alkoxy groups, or $R_4$ of the formula 1 comprises an amino group or a mercapto group, or $R_4$ of the formula 1 further comprises a phenyl group or an octyl group that is a bulky alkyl group. Furthermore preferably, $R_1$ to $R_3$ of the formula 1 are methoxy groups or ethoxy groups, respectively, and also $R_4$ of the formula 1 comprises an amino group or a mercapto group; and such examples include 3-aminopropyltrimethoxysilane, 3-aminopropyltriethoxysilane, 3-(2-aminoethylamino)propyltrimethoxysilane, 3-(2-aminoethylamino)propyltriethoxysilane, trimethoxy[3-(methylamino)propyl]silane, [3-(N,N-dimethylamino)propyl]trimethoxysilane, N-[3-(trimethoxysilyl)propyl]-1-butaneamine, [3-(diethylamino)propyl]trimethoxysilane, 3-[(1,3-dimethylbutylidene)amino]propyltriethoxysilane, (3-mercaptopropyl)trimethoxysilane, and (3-mercaptopropyl)triethoxysilane, etc.

Similarly, more preferable examples are those wherein $R_1$ to $R_3$ of the formula 1 are methoxy groups or ethoxy groups, respectively, and $R_4$ of the formula 1 further comprises a phenyl group or an octyl group, and those wherein $R_1$ to $R_3$ of the formula 1 are methoxy groups or ethoxy groups, respectively, and $R_4$ of the formula 1 comprises an amino group or a mercapto group, and $R_4$ further comprises a phenyl group or an octyl group; and such examples include trimethoxy[3-(phenylamino) propyl]silane, N-[2-(N-vinylbenzylamino)ethyl]-3-aminopropyltrimethoxysilane, and N,N-bis[(diphenylphosphino) methyl]-3-(triethoxysilyl)propylamine, N-[8-(trimethoxysilyl)octyl]ethane-1,2-diamine, etc.

As the silane coupling agent, in terms of easily available raw materials, most preferable examples are 3-aminopropyltrimethoxysilane, 3-aminopropyltriethoxysilane, 3-(2-aminoethylamino) propyltrimethoxysilane, and 3-(2-aminoethylamino)propyltriethoxysilane. On the other hand, from the viewpoint of etch selectivity of $Si_3 N_4$ relative to $SiO_2$, most preferable examples are 3-aminopropyltrimethoxysilane, 3-aminopropyltriethoxysilane, [3-(N,N-dimethylamino)propyl]trimethoxysilane, N-[2-(N-vinylbenzylamino)ethyl]-3-aminopropyltrimethoxysilane, N-[3-(trimethoxysilyl) propyl]-1-butaneamine, [3-(diethylamino)propyl]trimethoxysilane, (3-melcaptopropyl)trimethoxysilane, (3-mercaptopropyl)triethoxysilane, N-[8-(trimethoxysilyl)octyl]ethane-1,2-diamine, trimethoxy[3-(phenylamino)propyl]silane, and N,N-bis[(diphenylphosphino) methyl]-3-(triethoxysilyl)propylamine. In addition, from the viewpoint of suppressing pattern collapse of $SiO_2$ film, most preferable examples are trimethoxy[3-(phenylamino)propyl]silane and N-[8-(trimethoxysilyl)octyl]ethane-1,2-diamine.

The silane coupling agent may be used alone or in combination.

The concentration of the silane coupling agent in the etching liquid composition is not particularly limited, and it is preferably 0.01 to 10 wt %, more preferably 0.05 to 5 wt %, and still more preferably 0.1 to 3 wt %.

The etching liquid composition of the present invention comprises phosphoric acid. The concentration of phosphoric acid in the etching liquid composition is not particularly limited, and is preferably 60 to 95 wt %, more preferably 80 to 95 wt %.

The etching liquid composition of the present invention preferably comprises 0.01 to 10 wt % of a silane coupling agent and 60 to 95 wt % of phosphoric acid, and more preferably comprises 0.05 to 5 wt % of a silane coupling agent and 80 to 95 wt % of phosphoric acid, and furthermore preferably comprises 0.1 to 3 wt % of a silane coupling agent and 80 to 95 wt % of phosphoric acid.

The etching liquid composition of the present invention comprises the above-mentioned silane coupling agent and phosphoric acid, and these react and adsorb to the surface of $SiO_2$; as a result, $Si_3N_4$ can be selectively etched relative to $SiO_2$. Furthermore, by having a group comprising one or more selected from the group consisting of N atoms, O atoms, F atoms, P atoms, S atoms and Cl atoms or by further comprising a phenyl group or a bulky alkyl group in $R_4$ of the formula 1 of the silane coupling agent, regrowth of $SiO_2$ can be suppressed. In addition, by comprising a hydrophobic group, for example, a bulky alkyl group, a halogen group, a phenyl group or the like in $R_4$ of the silane coupling agent, the surface of the $SiO_2$ film can be made hydrophobic and pattern collapse of the $SiO_2$ film can be suppressed.

The etching liquid composition of the present invention comprises water. Water constitutes the balance of phosphoric acid, one or more silane coupling agents, and any additional components mentioned below that may be contained.

It is preferable that the etching liquid composition of the present invention further comprises a water-soluble polar organic solvent, because solubility of the silane coupling agent in the etching liquid composition is improved.

The water-soluble polar organic solvent is not particularly limited, and preferable examples are methanol, ethanol and acetone, and more preferable examples are methanol and ethanol. The water-soluble polar organic solvent may be used alone or in combination.

It is preferable that the etching liquid composition of the present invention further comprises an inorganic silicate, because selectivity of $SiO_2$ film relative to $Si_3O_4$ film is improved. The inorganic silicate forms $Si(OH)_x$ in the etching liquid composition.

The inorganic silicate is not particularly limited, and preferable examples are sodium silicate or potassium silicate.

The etching liquid composition of the present invention may comprise additional components other than the water-soluble polar organic solvent and the inorganic silicate, as long as they do not interfere with the etching of silicon nitride, and examples thereof include fluorine compounds. It is preferable that the etching liquid composition of the present invention further comprises a fluorine compound, because etching rate of $Si_3N_4$ becomes high. As the fluorine compound, hydrofluoric acid, ammonium fluoride and hexafluorosilicic acid are preferable, and hexafluorosilicic acid is more preferable.

The etching liquid composition of the present invention does not comprise ammonium ions. The etching liquid composition of the present invention can suppress regrowth of $SiO_2$ even when it does not comprise ammonium ions.

The present invention also relates to a method for producing a 3D non-volatile memory cell, which comprises etching silicon nitride using the etching liquid composition according to the present invention. Furthermore, the present invention also relates to a 3D non-volatile memory cell obtained by said method.

EXAMPLES

Next, the etching liquid composition of the present invention will be explained in more detail with reference to examples and comparative examples described below; however, the present invention is not limited thereto.

Evaluation 1: Etch Selectivity of $Si_3N_4$ Film/$SiO_2$ Film (Preparation of Wafer (Before Immersion))

Using a substrate in which a $Si_3N_4$ film was formed on a Si substrate, a $Si_3N_4$ wafer (before immersion) was obtained by cutting into a size of 15 mm×15 mm. Similarly, a $SiO_2$ wafer (before immersion) was obtained using a substrate on which a $SiO_2$ film was formed.

(Pretreatment of $Si_3N_4$ Wafer)

The $Si_3N_4$ wafer (before immersion) was immersed in a 0.6 wt % hydrofluoric acid aqueous solution and allowed to stand at 25° C. for 40 seconds. Then, the wafer was taken out and rinsed with ultrapure water (DIW) for 1 minute to obtain a $Si_3N_4$ wafer (after pretreatment).

(Immersion of Wafer in Etching Liquid Composition)

The above $Si_3N_4$ wafer (after pretreatment) was immersed in 100 mL of an etching liquid composition having the composition shown in Table 1, and stirred and immersed at 165° C. for 2 to 4 minutes. Then, the wafer was taken out and rinsed with ultrapure water (DIW) for 1 minute to obtain a $Si_3N_4$ wafer (after immersion).

In addition, the $SiO_2$ wafer (before immersion) was immersed in 100 mL of an etching liquid composition having the composition shown in Table 1, and stirred and immersed at 165°° C. for 30 to 60 minutes. Then, the wafer was taken out and rinsed with ultrapure water (DIW) for 1 minute to obtain a $SiO_2$ wafer (after immersion).

TABLE 1

| Sample | Phosphoric acid (wt %) | Silane coupling agent | (wt %) | Inorganic silicate | (wt %) | Water-soluble polar organic solvent | (wt %) | Water (wt %) |
|---|---|---|---|---|---|---|---|---|
| Comp. Ex. 1 | 85.5 | — | — | — | — | — | — | 14.5 |
| Comp. Ex. 2 | 85.22 | — | — | Potassium silicate | 0.02 | — | — | 14.76 |
| Ex. 1 | 85.07 | 3-aminopropyltri-ethoxysilane | 0.5 | — | — | — | — | 14.43 |
| Ex. 2 | 84.43 | 3-aminopropyltri-ethoxysilane | 0.5 | — | — | Ethanol | 0.75 | 14.32 |
| Ex. 3 | 84.43 | 3-(2-aminoethylamino) propyltrimethoxysilane | 0.5 | — | — | Ethanol | 0.75 | 14.32 |
| Ex. 4 | 84.43 | 3-aminopropyltriethoxysilane | 0.25 | — | — | Ethanol | 0.75 | 14.32 |

TABLE 1-continued

| Sample | Phosphoric acid (wt %) | Silane coupling agent | (wt %) | Inorganic silicate | (wt %) | Water-soluble polar organic solvent | (wt %) | Water (wt %) |
|---|---|---|---|---|---|---|---|---|
| | | 3-(2-aminoethylamino) propyltrimethoxysilane | 0.25 | | | | | |
| Ex. 5 | 84.15 | 3-aminopropyltri-ethoxysilane | 0.25 | Sodium metasilicate | 0.03 | Ethanol | 0.75 | 14.57 |
| | | 3-(2-aminoethylamino) propyltrimethoxysilane | 0.25 | | | | | |
| Ex. 6 | 84.15 | 3-aminopropyltri-ethoxysilane | 0.25 | Potassium silicate | 0.02 | Ethanol | 0.75 | 14.58 |
| | | 3-(2-aminoethylamino) propyltrimethoxysilane | 0.25 | | | | | |
| Ex. 7 | 84.21 | [3-(N,N-dimethylamino) propyl]trimethoxysilane | 0.47 | Potassium silicate | 0.02 | Ethanol | 0.7 | 14.59 |
| Ex. 8 | 83.99 | trimethoxy[3-(phenylamino) propyl]silane | 0.58 | Potassium silicate | 0.02 | Ethanol | 0.86 | 14.55 |
| Ex. 9 | 83.07 | N-[2-(N-vinylbenzylamino) ethyl]-3-aminopropyltri-methoxysilane | 0.84 | Potassium silicate | 0.02 | Ethanol | 1.67 | 14.39 |
| Ex. 10 | 83.51 | N-[3-(trimethoxysilyl) propyl]-1-butaneamine | 0.8 | Potassium silicate | 0.02 | Ethanol | 1.2 | 14.47 |
| Ex. 11 | 84.09 | [3-(diethylamino) propyl]trimethoxysilane | 0.53 | Potassium silicate | 0.02 | Ethanol | 0.79 | 14.57 |
| Ex. 12 | 84.07 | (3-mercaptopropyl) triethoxysilane | 0.44 | Potassium silicate | 0.02 | Ethanol | 0.81 | 14.66 |
| Ex. 13 | 84.03 | N,N-bis[(diphenylphosphino) methyl]-3-(triethoxysilyl) propylamine | 1.39 | Potassium silicate | 0.02 | — | — | 14.56 |
| Ex. 14 | 83.8 | N-[8-(trimethoxysilyl) octyl]ethane-1,2-amine | 0.66 | Potassium silicate | 0.02 | Ethanol | 0.99 | 14.53 |

(Measurement of Etching Rate of Etching Liquid Composition)

The film thickness of the $Si_3N_4$ wafer (after pretreatment) or $SiO_2$ wafer (before immersion) was measured with a reflection spectroscopic film thickness measurement system (manufactured by Otsuka Electronics Co., Ltd., model number: FE-3000), and the film thickness of the $Si_3N_4$ wafer or $SiO_2$ wafer (after immersion) was measured with a reflection spectroscopic film thickness measurement system (manufactured by Otsuka Electronics Co., Ltd., model number: FE-3000). The etching rate (E. R.) of the etching liquid composition for $Si_3N_4$ or $SiO_2$ is calculated from the film thickness difference before and after immersion, and the etching rate of $Si_3N_4$ is divided by the etching rate of $SiO_2$ to obtain the etch selectivity of $Si_3N_4$ film/$SiO_2$ film. The results are shown in Table 2.

Evaluation 2: Presence or Absence of Oxide Film Growth (Preparation of Wafer (before Immersion))

A substrate on which a $Si_3N_4$ film and a $SiO_2$ film were alternately laminated, and grooves (intervals) were formed on the laminated film by dry etching, was cut into a size of 15 mm×15 mm to obtain a wafer for evaluation.

(Pretreatment of Evaluation Wafer)

The above evaluation wafer (before immersion) was immersed in a 0.6 wt % hydrofluoric acid aqueous solution and allowed to stand at 25° C. for 40 seconds. Then, the wafer was taken out and rinsed with ultrapure water (DIW) for 1 minute to obtain an evaluation wafer (after pretreatment).

(Immersion of Wafer in Etching Liquid Composition)

The above evaluation wafer (after pretreatment) was immersed in 100 mL of an etching liquid composition having the composition shown in Table 1, and stirred and immersed at 165° C. for 60 minutes. Then, the wafer was taken out and rinsed with ultrapure water (DIW) for 1 minute to obtain the above evaluation wafer (after immersion).

(Confirmation of Oxide Film Growth of Etching Liquid Composition)

The above evaluation wafer (after immersion) was observed with an FE-SEM (manufactured by Hitachi High-Technologies Corporation, model number: SU8220) to confirm the presence or absence of oxide film growth. The results are shown in Table 2.

Evaluation 3: Contact Angle of Water on $SiO_2$ Film (Preparation of wafer (before immersion))

A substrate on which a $SiO_2$ film was formed was cut into a size of 15 mm×15 mm to obtain a $SiO_2$ wafer (before immersion).

(Immersion of Wafer in Etching Liquid Composition)

The above $SiO_2$ wafer (before immersion) was immersed in 100 mL of an etching liquid composition having the composition shown in Table 1, and stirred and immersed at 165° C. for 10 minutes. Then, the wafer was taken out and rinsed with ultrapure water (DIW) for 1 minute to obtain the above evaluation wafer (after immersion).

(Measurement of Contact Angle of Water on $SiO_2$ Film after Treatment with Etching Liquid Composition)

The contact angle of the above $SiO_2$ wafer (after immersion) was measured with a solid-liquid interface analyzer (manufactured by Kyowa Interface Science Co., ltd., model number: DropMaster 500). The results are shown in Table 2.

TABLE 2

| Sample | $Si_2N_4/SiO_2$ etch selectivity | Presence/absence of oxide film growth | Water contact angle on $SiO_2$ film |
|---|---|---|---|
| Comp. Ex. 1 | 73 | None | Less than 5° |
| Comp. Ex. 1 | 1000 or more | Present | Less than 5° |
| Example 1 | 184 | None | 5.5° |
| Example 2 | 158 | None | 8.1° |
| Example 3 | 160 | None | 5.4° |
| Example 4 | 244 | None | 11.5° |
| Example 5 | 1000 or more | None | 5.9° |
| Example 6 | 1000 or more | None | 8.3° |
| Example 7 | 1000 or more | None | 5.2° |
| Example 8 | 1000 or more | None | 36.7° |
| Example 9 | 1000 or more | None | 72.5° |
| Example 10 | 1000 or more | None | 32.0° |
| Example 11 | 1000 or more | None | 15.3° |
| Example 12 | 1000 or more | None | 5.7° |
| Example 13 | 1000 or more | None | 29.1° |
| Example 14 | 1000 or more | None | 38.7° |

The invention claimed is:

1. A method of producing a 3D non-volatile memory cell having silicon dioxide (SiO2)pattern, in which collapse of the silicon dioxide (SiO2) pattern is restricted, which comprises etching silicon nitride in a substrate of silicon dioxide (SiO2) and silicon nitride (Si3N4) being alternately multiple laminated using an etching liquid composition, wherein the etching liquid composition is selected from:

an etching liquid composition consisting of phosphoric acid, one or more kinds of silane coupling agents and water;

an etching liquid composition consisting of phosphoric acid, one or more kinds of silane coupling agents, water and a water-soluble polar organic solvent;

an etching liquid composition consisting of phosphoric acid, one or more kinds of silane coupling agents, water and an inorganic silicate; and an etching liquid composition consisting of phosphoric acid, one or more kinds of silane coupling agents, water, a water-soluble polar organic solvent and an inorganic silicate.

2. The method of claim 1, wherein the silane coupling agent is a compound represented by the formula 1:

[Chemical formula 1]

(formula I)

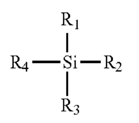

wherein $R_1$ is an alkyl group or an alkoxy group, $R_2$ is an alkyl group or an alkoxy group, $R_3$ is an alkyl group or an alkoxy group, and $R_4$ is a group comprising one or more selected from the group consisting of N atoms, O atoms, S atoms, P atoms, CI atoms and F atoms.

3. The method of claim 2, wherein the silane coupling agent is the one in which at least two of $R_1$, $R_2$, and $R_3$ in the formula 1 are alkoxy groups.

4. The method of claim 2, wherein the silane coupling agent comprises an amino group or a mercapto group in $R_4$ of the formula 1.

5. The method of claim 2, wherein the silane coupling agent further comprises a phenyl group or an octyl group in $R_4$ of the formula 1.

6. The method of claim 2, wherein the silane coupling agent is selected from the group consisting of 3-aminopropyltrimethoxysilane, 3-aminopropyltriethoxysilane, 3-(2-aminoethylamino)propyltrimethoxysilane, 3-(2-aminoethylamino)propyltriethoxysilane, trimethoxy[3-(methylamino)propyl]silane, [3-(N,N-dimethylamino)propyl]trimethoxysilane, trimethoxy[3-(phenylamino)propyl]silane, N-[2-(N-vinylbenzylamino)ethyl]-3-aminopropyltrimethoxysilane, N-[8-(trimethoxysilyl)octyl]ethane-1,2-diamine, N-[3-(trimethoxysilyl)propyl]-1-butaneamine, [3-(diethylamino)propyl]trimethoxysilane, 3-[(1,3-dimethylbutylidene)amino]propyltriethoxysilane, (3-mercaptopropyl) trimethoxysilane, (3-mercaptopropyl) triethoxysilane and N,N-bis[(diphenylphosphino)methyl]-3-(triethoxysilyl)propylamine.

7. The method of claim 1, wherein the etching liquid composition comprises 60 to 95 wt % of phosphoric acid and 0.01 to 10 wt % of a silane coupling agent.

8. A method for etching silicon nitride which etches silicon nitride in a substrate of silicon dioxide ($SiO_2$) and silicon nitride ($Si_3N_4$) being alternately multiple laminated using an etching liquid composition in production of a 3D non-volatile memory cell having silicon dioxide ($SiO_2$) pattern, wherein the etching liquid composition is selected from:

an etching liquid composition consisting of phosphoric acid, one or more kinds of silane coupling agents and water;

an etching liquid composition consisting of phosphoric acid, one or more kinds of silane coupling agents, water and a water-soluble polar organic solvent;

an etching liquid composition consisting of phosphoric acid, one or more kinds of silane coupling agents, water and an inorganic silicate; and an etching liquid composition consisting of phosphoric acid, one or more kinds of silane coupling agents, water, a water-soluble polar organic solvent and an inorganic silicate; and wherein collapse of the silicon dioxide ($SiO_2$) pattern is restricted.

* * * * *